(12) United States Patent
Tamura et al.

(10) Patent No.: US 7,271,414 B2
(45) Date of Patent: Sep. 18, 2007

(54) SEMICONDUCTOR DEVICE AND METHOD FOR FABRICATING THE SAME

(75) Inventors: Nobuyuki Tamura, Kyoto (JP);
Takehisa Kishimoto, Shiga (JP);
Mizuki Segawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/336,970

(22) Filed: Jan. 23, 2006

(65) Prior Publication Data

US 2006/0170117 A1 Aug. 3, 2006

(30) Foreign Application Priority Data

Feb. 1, 2005 (JP) .............................. 2005-025329

(51) Int. Cl.
*H01L 31/112* (2006.01)
*H01L 27/082* (2006.01)

(52) U.S. Cl. .................. 257/69; 257/511; 257/574; 257/900; 257/E27.064

(58) Field of Classification Search .................. 257/69, 257/511, 574, 900, E21.661, E27.632, 21.434
See application file for complete search history.

(56) References Cited

U.S. PATENT DOCUMENTS 5,759,885 A * 6/1998 Son .............................. 438/230
6,512,273 B1 * 1/2003 Krivokapic et al. ........ 257/369
7,157,374 B1 * 1/2007 Waite et al. ................. 438/689

FOREIGN PATENT DOCUMENTS

| JP | 8-264554 A | 10/1996 |
|---|---|---|
| JP | 2003-100902 A | 4/2003 |

* cited by examiner

*Primary Examiner*—Long K. Tran
(74) *Attorney, Agent, or Firm*—McDermott Will & Emery LLP (57) ABSTRACT

A semiconductor device includes a transistor of a first conductivity type and a transistor of a second conductivity type. The transistor of the first conductivity type includes a first gate portion formed on a first region of a semiconductor substrate, a first sidewall formed on each side face of the first gate portion, a first protecting film formed between the first sidewall and the first gate portion, and an extension diffusion layer of the first conductivity type. The transistor of the second conductivity type includes a second gate portion formed on a second region of the semiconductor substrate, a second sidewall formed on each side face of the second gate portion, a second protecting film having an L-shaped cross-section and formed between the second sidewall and the second gate portion and between the second sidewall and the semiconductor substrate, and an extension diffusion layer of the second conductivity type.

7 Claims, 8 Drawing Sheets

SEMICONDUCTOR DEVICE AND METHOD FOR FABRICATING THE SAME

CROSS-REFERENCE TO RELATED APPLICATIONS

This application claims priority under 35 U.S.C. §119 on Patent Application No. 2005-025329 filed in Japan on Feb. 1, 2005, the entire contents of which are hereby incorporated by reference.

BACKGROUND OF THE INVENTION

The present invention relates to a semiconductor device and a method for fabricating the same, and more particularly, it relates to a semiconductor device mixedly including an NMOS transistor and a PMOS transistor formed on a substrate and a method for fabricating the same.

In a general semiconductor device, both an NMOS transistor and a PMOS transistor are formed on one semiconductor substrate. In this case, it is necessary to implant n-type impurity ions alone in an n-type impurity diffusion layer and to implant p-type impurity ions alone in a p-type impurity diffusion layer. Therefore, the ion implantation should be performed with an NMOS transistor forming region and a PMOS transistor forming region alternately masked.

For example, Japanese Laid-Open Patent Publication No. 2003-100902 discloses a method for fabricating a semiconductor device mixedly including an NMOS transistor and a PMOS transistor formed on a substrate. In the method disclosed in this publication, a gate electrode of the NMOS transistor and a gate electrode of the PMOS transistor are formed respectively on an NMOS region and a PMOS region of the substrate. Then, offset spacers for covering the side faces of the gate electrodes are formed.

Next, after a first resist mask having an opening in the NMOS region is formed on the substrate, an n-type extension region is formed by selectively implanting an n-type impurity such as arsenic into the substrate. Then, after removing the first resist mask by ashing and cleaning, a second resist mask having an opening in the PMOS region is formed, and a p-type extension region is formed by selectively implanting a p-type impurity such as boron into the substrate.

Next, sidewalls are formed on the side faces of the offset spacers of the gate electrodes. Subsequently, a third resist mask for exposing an n-type transistor forming region is formed on the substrate, and n-type source/drain diffusion layers are formed by selectively implanting the n-type impurity into the substrate. Furthermore, after removing the third resist mask, a fourth resist mask for exposing a p-type transistor forming region is formed, and p-type source/drain diffusion layers are formed by selectively implanting the p-type impurity into the substrate. Thus, both the NMOS transistor and the PMOS transistor can be formed on the substrate.

In the conventional fabrication method, however, the PMOS region and the gate electrode of the PMOS transistor are doped with the n-type impurity such as arsenic in removing the first resist mask, so as to disadvantageously degrade the characteristics of the PMOS transistor.

In forming the n-type extension region, the n-type impurity such as arsenic is implanted also into the first resist mask. Since arsenic is a comparatively heavy element, the n-type impurity having been implanted into the first resist mask does not vaporize but is concentrated during the ashing, so as to ultimately diffuse into the PMOS region and the gate electrode of the PMOS transistor.

The p-type extension region is a shallow junction and hence is largely affected by merely a small amount of n-type impurity present in the vicinity of the surface of the PMOS region. As a result, there arises a problem that the threshold value of the PMOS transistor is varied or the operation characteristics thereof are degraded.

Also, in the case where a heavy element such as indium is used as the p-type impurity for forming the p-type extension region, a similar problem arises in the NMOS transistor. Specifically, the NMOS region and the gate electrode of the NMOS transistor are doped with the indium having been implanted into the second resist mask in removing the second resist mask, so as to disadvantageously degrade the characteristics of the NMOS transistor.

SUMMARY OF THE INVENTION

An object of the invention is overcoming the aforementioned conventional problem, namely, preventing an impurity implanted into a resist mask during ion implantation from doping an extension forming region during ashing, so as to realize a semiconductor device and a method for fabricating the same in which characteristic degradation of transistors can be avoided.

The semiconductor device of this invention includes a transistor of a first conductivity type and a transistor of a second conductivity type, and the transistor of the first conductivity type includes a first gate portion including a first gate insulating film and a first gate electrode formed on a first region of a semiconductor substrate; a first sidewall made of a first insulating film formed on a side face of the first gate portion; a first protecting film formed between the first sidewall and the first gate portion; and an extension diffusion layer of the first conductivity type formed in a portion of the first region on a side of the first gate portion, and the transistor of the second conductivity type includes a second gate portion including a second gate insulating film and a second gate electrode formed on a second region of the semiconductor substrate; a second sidewall made of the first insulating film formed on a side face of the gate portion; a second protecting film having an L-shaped cross-section and formed between the second sidewall and the second gate portion and between the second sidewall and the semiconductor substrate; and an extension diffusion layer of the second conductivity type formed in a portion of the second region on a side of the second gate portion.

In the semiconductor device of this invention, the second protecting film can be used as a protecting film for preventing the second region from being contaminated with the impurity of the first conductivity type in implanting the impurity ion of the first conductivity type. Accordingly, a region where the transistor of the second conductivity type is formed can be prevented from being contaminated with the impurity ion of the first conductivity type, resulting in preventing variation of the threshold value of the transistor of the second conductivity type included in the semiconductor device.

In the semiconductor device of the invention, the first protecting film and the second protecting film are preferably made of a second insulating film, and the first protecting film preferably has an I-shaped cross-section. Thus, the first protecting film works as an offset spacer, so as to improve accuracy in the position of the extension diffusion layer of the first conductivity type against the first gate electrode.

In the semiconductor device of the invention, the first protecting film and the second protecting film are preferably made of a second insulating film, and the first protecting film is preferably formed between the first sidewall and the first gate portion and between the first sidewall and the semiconductor device and preferably has an L-shaped cross-section. Thus, a region where the transistor of the first conductivity type is formed can be prevented from being contaminated in implanting the impurity ion of the second conductivity type.

In the semiconductor device of the invention, the first protecting film preferably includes an impurity of the second conductivity type. In this case, the impurity of the second conductivity type is preferably indium.

In the semiconductor device of the invention, the transistor of the second conductivity type preferably further includes a third protecting film formed between the second gate portion and the second protecting film, the first protecting film and the third protecting film are preferably made of a second insulating film having an I-shaped cross-section, and the second protecting film is preferably made of a third insulating film. Thus, the first protecting film and the third protecting film work as offset spacers, so as to improve the position of the extension diffusion layer against the gate electrode.

In the semiconductor device of the invention, the second protecting film preferably includes an impurity of the first conductivity type. Thus, the impurity of the first conductivity type can be prevented from diffusing into the region where the transistor of the second conductivity type is formed. In this case, the impurity of the first conductivity type is arsenic or antimony.

In the semiconductor device of the invention, it is preferred that the transistor of the first conductivity type is an n-type MOS transistor and that the transistor of the second conductivity type is a p-type MOS transistor.

The first method for fabricating a semiconductor device of this invention includes the steps of (a) forming a first gate portion including a first gate insulating film and a first gate electrode on a first region of a semiconductor substrate and a second gate portion including a second gate insulating film and a second gate electrode on a second region of the semiconductor substrate; (b) forming an insulating film over the semiconductor substrate including side faces and top faces of the first gate portion and the second gate portion after the step (a); (c) forming a first resist mask having an opening in the first region on the insulating film in the second region after the step (b); (d) forming an extension diffusion layer of a first conductivity type by implanting an impurity ion of the first conductivity type into the first region by using, as a mask, the first gate portion, a portion of the insulating film formed on the side face of the first gate portion and the first resist mask after the step (c); (e) forming, on the first region, a second resist mask having an opening in the second region after the step (b); (f) forming an extension diffusion layer of a second conductivity type by implanting an impurity ion of the second conductivity type into the second region by using, as a mask, the second gate portion, a portion of the insulating film formed on the side face of the second gate portion and the second resist mask after the step (e); and (g) forming a first sidewall on the side face of the first gate portion with a first protecting film made of the portion of the insulating film formed on the side face of the first gate portion sandwiched therebetween and forming a second sidewall on the side face of the second gate portion with a second protecting film made of the portion of the insulating film formed on the side face of the second gate portion sandwiched therebetween after the steps (d) and (f).

In the first method for fabricating a semiconductor device of this invention, the impurity ion of the first conductivity type having been implanted into the first resist mask in forming the extension region of the first conductivity type never diffuses into the second region beyond the insulating film. Accordingly, the second region can be prevented from being contaminated with the impurity ion of the first conductivity type, resulting in preventing degradation of the threshold value and the characteristics of the transistor of the second conductivity type.

In the first method for fabricating a semiconductor device of the invention, the step (g) preferably includes a sub-step of forming the second protecting film having an L-shaped cross-section between the second sidewall and the second gate portion and between the second sidewall and the semiconductor substrate by etching the insulating film in the second region after forming the second sidewall.

The first method for fabricating a semiconductor device of the invention preferably further includes, after the step (c) and before the step (d), a step (h) of forming the first protecting film having an I-shaped cross-section on the side face of the first gate portion by selectively etching the insulating film in the first region by using the first resist mask as a mask, the extension diffusion layer of the first conductivity type is preferably formed by using the first gate portion, the first protecting film and the first resist mask as a mask in the step (d), and the first sidewall is preferably formed on the side face of the first gate portion with the first protecting film sandwiched therebetween in the step (g).

In the first method for fabricating a semiconductor device of the invention, the step (g) preferably includes a sub-step of forming the first protecting film having an L-shaped cross-section between the first sidewall and the first gate portion and between the first sidewall and the semiconductor substrate by etching the insulating film in the first region after forming the first sidewall.

In the first method for fabricating a semiconductor device of the invention, the step (e) is preferably performed after the step (d).

In the first method for fabricating a semiconductor device of the invention, the step (c) is preferably performed after the step (f).

The first method for fabricating a semiconductor device of the invention preferably further includes , after the step (d), a step (i) of removing the first resist mask by ashing, and the impurity ion of the first conductivity type having been implanted into the first resist mask is preferably introduced into the insulating film in the step (i).

In the first method for fabricating a semiconductor device of the invention, the impurity ion of the first conductivity type is preferably arsenic or antimony.

The second method for fabricating a semiconductor device of this invention includes the steps of (a) forming a first gate portion including a first gate insulating film and a first gate electrode on a first region of a semiconductor substrate and a second gate portion including a second gate insulating film and a second gate electrode on a second region of the semiconductor substrate; (b) forming a first protecting film having an I-shaped cross-section on a side face of the first gate portion and a second protecting film having an I-shaped cross-section on a side face of the second gate portion after the step (a); (c) forming, on the first region, a first resist mask having an opening in the second region after the step (b); (d) forming an extension diffusion layer of a first conductivity type by implanting an impurity ion of the first conductivity type into the second region by using the second gate portion, the second protecting film and the first resist mask as a mask after the step (c); (e) forming an insulating film covering the second region after the step (d); (f) forming a second resist mask having an opening in the first region on the insulating film in the second region; (g) forming an extension diffusion layer of a second conductivity type by implanting an impurity ion of the second conductivity type into the first region by using the first gate portion, the first protecting film and the second resist mask as a mask after the step (f); (h) forming a first sidewall on the side face of the first gate portion with the first protecting film sandwiched therebetween and a second sidewall on the side face of the second gate portion with the second protecting film and the insulating film sandwiched therebetween after the steps (d) and (f); and (i) forming a third protecting film having an L-shaped cross-section between the second sidewall and the second gate portion and between the second sidewall and the semiconductor substrate by etching the insulating film in the second region after forming the second sidewall.

In the second method for fabricating a semiconductor device of this invention, the impurity ion of the second conductivity type having been implanted into the second resist mask in forming the extension region of the second conductivity type never diffuses into the second region beyond the insulating film. Accordingly, the second region can be prevented from being contaminated with the impurity ion of the second conductivity type, resulting in preventing degradation of the threshold value and the characteristics of the transistor of the first conductivity type.

The second method for fabricating a semiconductor device of the invention preferably further includes, after the step (g), a step (j) of removing the second resist mask by ashing, and the impurity ion of the second conductivity type having been implanted into the second resist mask is preferably introduced into the insulating film in the step (j).

DETAILED DESCRIPTION OF THE INVENTION

Embodiment 1

Figure 1:
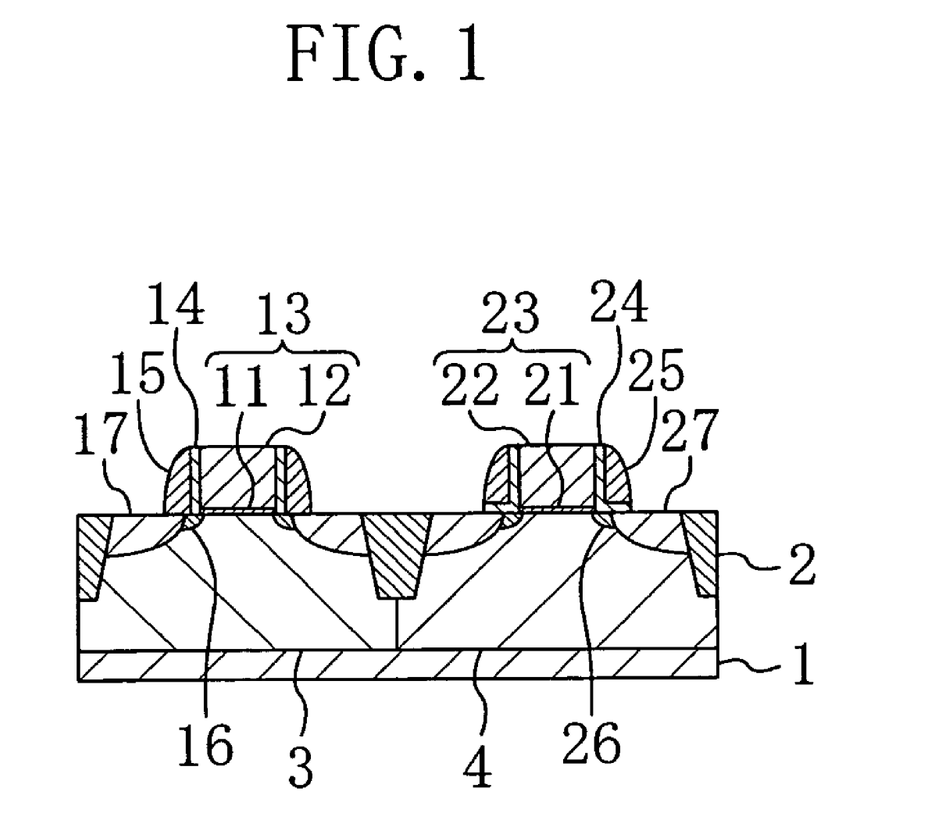
FIG. 1 is a cross-sectional view of a semiconductor device according to Embodiment 1 of the invention.

A semiconductor device and a fabrication method for the same according to Embodiment 1 of the invention will now be described with reference to the accompanying drawings. FIG. 1 shows the cross-sectional structure of the semiconductor device of this embodiment. As shown in FIG. 1, an NMOS region 3 including a p-type well and a PMOS region 4 including an n-type well spaced from each other by an isolation 2 are formed in a semiconductor substrate 1 of silicon.

A gate portion 13 of an NMOS transistor composed of a gate insulating film 11 and a gate electrode 12 successively formed in the upward direction is formed on the NMOS region 3. A gate portion 23 of a PMOS transistor composed of a gate insulating film 21 and a gate electrode 22 successively formed in the upward direction is formed on the PMOS region 4.

N-type source/drain diffusion layers 17 corresponding to impurity diffusion layers where ions of an n-type impurity such as arsenic are implanted are formed in the NMOS region 3. The n-type source/drain diffusion layers 17 include n-type extension regions 16 formed in portions thereof below both side faces of the gate portion 13 and having a comparatively small junction depth. Similarly, p-type source/drain diffusion layers 27 where ions of a p-type impurity such as boron are implanted and which include p-type extension regions 26 are formed in the PMOS region 4.

An offset spacer 14 having an I-shaped (plate-shaped) cross-section and made of an oxide film is formed on each side face of the gate portion 13 of the NMOS transistor. A sidewall 15 of silicon nitride (SiN) is formed on the side face of the offset spacer 14. At this point, the I-shaped (plate-shaped) cross-section corresponds to the shape of the offset spacer 14 remaining on the side face of the gate portion 13 through fabrication procedures shown in FIGS. 2D and 2E.

On the other hand, an offset spacer 24 having an L-shaped cross-section and made of an oxide film is formed on the side face of the gate portion 23 of the PMOS transistor and on the top face of the semiconductor substrate 1 around the gate portion 23. A sidewall 25 of SiN is formed on the side face of the offset spacer 24. In the semiconductor device of this embodiment, the offset spacer 24 includes an n-type impurity such as arsenic as described below.

Figure 2A:
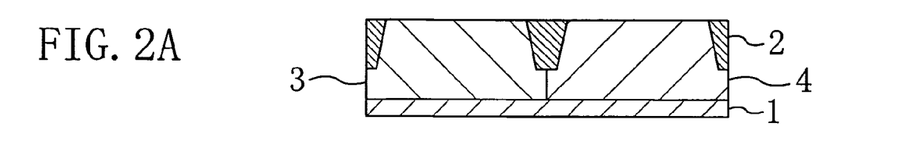
FIGS. 2A, 2B, 2C, 2D and 2E are cross-sectional views for showing procedures in a method for fabricating the semiconductor device of Embodiment 1.

Now, the fabrication method for the semiconductor device of this embodiment will be described with reference to the accompanying drawings. FIGS. 2A through 2E and 3A through 3D are cross-sectional views for showing procedures in the fabrication method for the semiconductor device of this embodiment. First, as shown in FIG. 2A, after forming an isolation 2 in an upper portion of a semiconductor substrate 1 by a general isolation forming method, an NMOS region 3 including a p-type well and a PMOS region 4 including an n-type well are formed by implanting impurities into the semiconductor substrate 1.

Figure 2B:
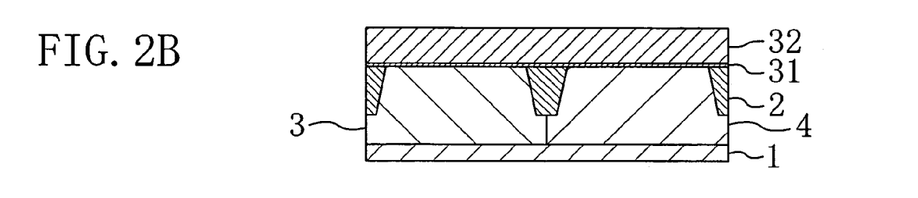

Next, as shown in FIG. 2B, an insulating film 31 is formed on the semiconductor substrate 1 by thermal oxidation or the like, and a polysilicon film 32 with a thickness of approximately 180 nm is deposited on the insulating film 31.

Figure 2C:
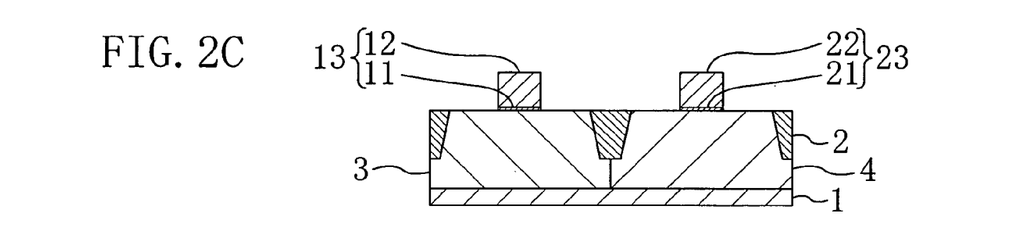

Then, as shown in FIG. 2C, a gate portion 13 of an NMOS transistor composed of a gate insulating film 11 and a gate electrode 12 and a gate portion 23 of a PMOS transistor composed of a gate insulating film 21 and a gate electrode 22 are respectively formed on the NMOS region 3 and the PMOS region 4 through patterning by photolithography and dry etching.

Figure 2D:
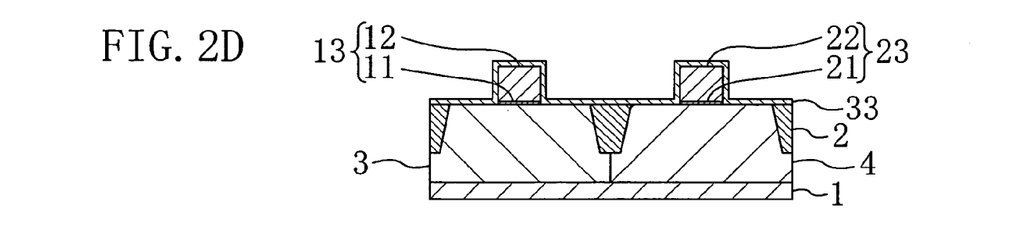

Next, as shown in FIG. 2D, an oxide film 33 with a thickness of approximately 14 nm is deposited by chemical vapor deposition (CVD) so as to cover the top face of the substrate 1 and the side faces and the top faces of the gate portions 13 and 23. The oxide film 33 may be a film obtained by high-temperature oxidation (HTO) or the like.

Figure 2E:
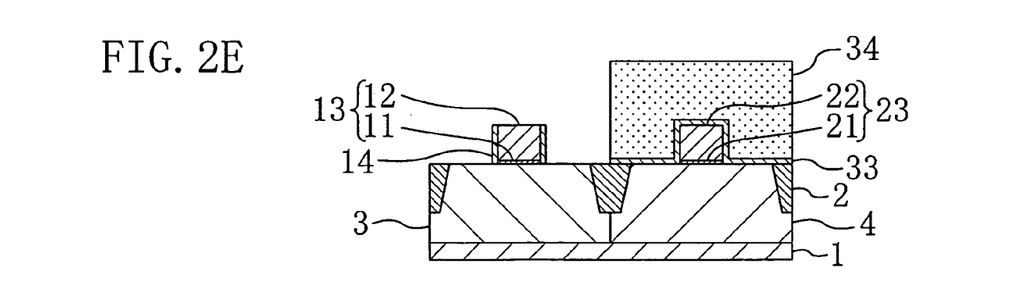

Then, as shown in FIG. 2E, a resist mask 34 having an opening in the NMOS region 3 and covering the PMOS region 4 is formed on the oxide film 33. Thereafter, the oxide film 33 is etched back by using the resist mask 34 as a mask, thereby forming an offset spacer 14 on each side face of the gate portion 13 in the NMOS region 3. The offset spacer 14 thus obtained has a width of approximately 10 nm.

Figure 3A:
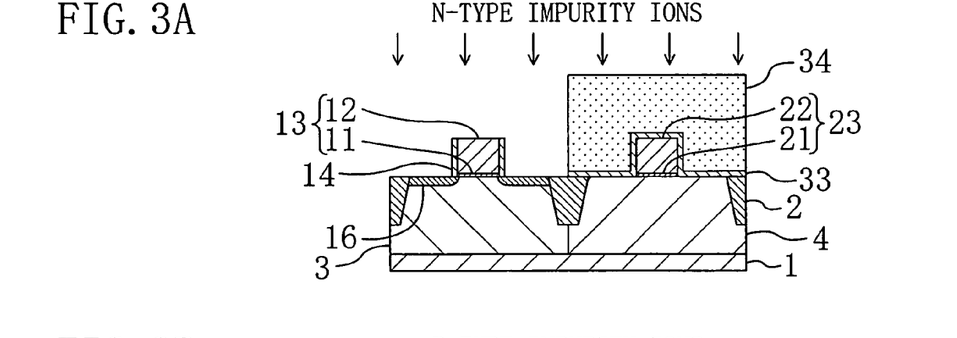
FIGS. 3A, 3B, 3C and 3D are cross-sectional views for showing other procedures in the method for fabricating the semiconductor device of Embodiment 1.

Next, as shown in FIG. 3A, n-type extension regions 16 are formed by implanting an n-type impurity such as arsenic into portions of the NMOS region 3 below the side faces of the gate portion 13 of the NMOS transistor by using the gate electrode 12, the offset spacer 14 and the resist mask 34 as a mask. The ion implantation is performed at a dose of $2 \times 10^{14}$ ions/cm$^2$ through $5 \times 10^{15}$ ions/cm$^2$ and implantation energy of 0.1 keV through 10 keV so as to make the junction comparatively shallow.

Figure 3B:
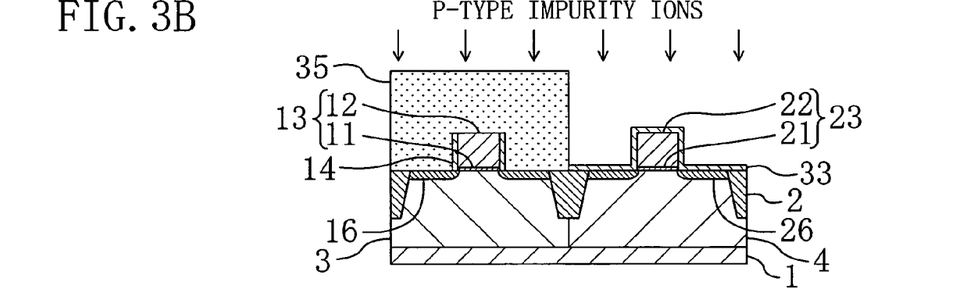

Then, as shown in FIG. 3B, the resist mask 34 is removed by ashing and cleaning. Thereafter, a resist mask 35 having an opening in the PMOS region 4 and covering the NMOS region 3 is formed on the substrate, and with a portion of the oxide film 33 formed on the side face of the gate portion 23 used as an offset spacer forming mask, p-type extension regions 26 are formed by implanting a p-type impurity such as boron through the oxide film 33 into portions of the PMOS region 4 below the side faces of the gate portion 23 of the PMOS transistor. The ion implantation is performed at implantation energy of 0.1 keV through 5 keV and a dose of $1 \times 10^{14}$ ions/cm$^2$ through $5 \times 10^{15}$ ions/cm$^2$.

Figure 3C:
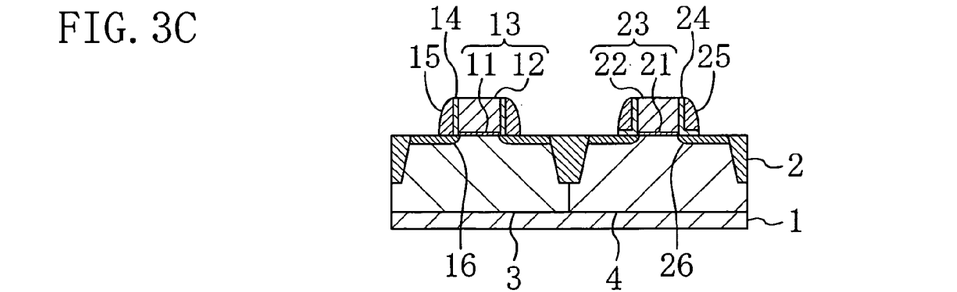

Subsequently, as shown in FIG. 3C, after removing the resist mask 35, a SiN film with a thickness of approximately 65 nm is deposited on the semiconductor substrate 1, and an unwanted portion of the SiN film is removed by etch back, thereby forming a sidewall 15 on each side face of the gate portion 13 of the NMOS transistor with the offset spacer 14 sandwiched therebetween. In the PMOS region 4, unwanted portions of the SiN film and the oxide film 33 are removed, so as to form a sidewall 25 made of the SiN film on each side face of the gate portion 23 of the PMOS transistor with an L-shaped offset spacer 24 made of the oxide film 33 sandwiched therebetween.

Figure 3D:
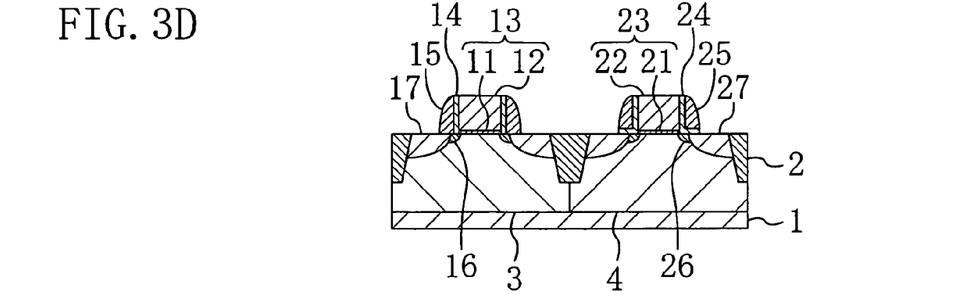

Ultimately, as shown in FIG. 3D, an n-type impurity is selectively implanted into the NMOS region 3 by using the offset spacer 14 and the sidewall 15 as an implantation mask. Also, a p-type impurity is selectively implanted into the PMOS region 4 by using the offset spacer 24 and the sidewall 25 used as an implantation mask. The ion implantation of the n-type impurity is performed at implantation energy of 10 keV through 100 keV and a dose of $1 \times 10^{15}$ ions/cm$^2$ through $5 \times 10^{16}$ ions/cm$^2$, and the ion implantation of the p-type impurity is performed at implantation energy of 1 keV through 10 keV and a dose of $1 \times 10^{15}$ ions/cm$^2$ through $5 \times 10^{16}$ ions/cm$^2$. Thereafter, the impurities are activated through annealing, so as to form n-type source/drain diffusion layers 17 and p-type source/drain diffusion layers 27.

In forming the n-type extension regions 16, the n-type impurity is implanted also into the resist mask 34. Arsenic generally used as the n-type impurity is a comparatively heavy element and minimally vaporizes during the ashing. Therefore, when the resist mask 34 is removed by the ashing, the arsenic remains on the surface of the oxide film 33 in contact with the bottom of the resist mask 34 and is further diffused into the oxide film 33. However, the arsenic is diffused into the oxide film 33 merely by several nm, and hence, the top face of the semiconductor substrate 1 beyond the oxide film 33 is never doped with the arsenic. Accordingly, contamination of the PMOS region 4 with the n-type impurity can be prevented, so that variation of the threshold value and the operation characteristics of the PMOS transistor can be prevented. Also, contamination of the gate electrode 22 of the PMOS transistor with the n-type impurity can be simultaneously prevented.

Although arsenic is used as the n-type impurity in this embodiment, similar effects can be attained also in using antimony as the n-type impurity.

In this embodiment, the unwanted portion of the oxide film 33 in the PMOS region 4 is removed simultaneously with the removal of the unwanted portion of the SiN film for reducing the number of procedures. However, the portions of the oxide film 33 formed on the PMOS region 4 and on the top face of the gate electrode 22 can be removed any time after forming the n-type extension regions 16. For example, before the ion implantation performed for forming the p-type extension regions 26, a portion of the oxide film 33 excluding a portion thereof formed on each side face of the gate portion 23 may be removed by the etch back, and thus, the ion implantation can be performed without being affected by the oxide film 33. Also, the structure of the gate portion 23 of the PMOS transistor can be made equivalent to the structure of the gate portion 13 of the NMOS transistor.

Although the contamination of the PMOS region 4 caused in forming the n-type extension regions 16 is prevented in this embodiment, contamination of the NMOS region 3 caused in forming the p-type extension regions 26 can be similarly prevented.

Modification of Embodiment 1

Figure 4A:
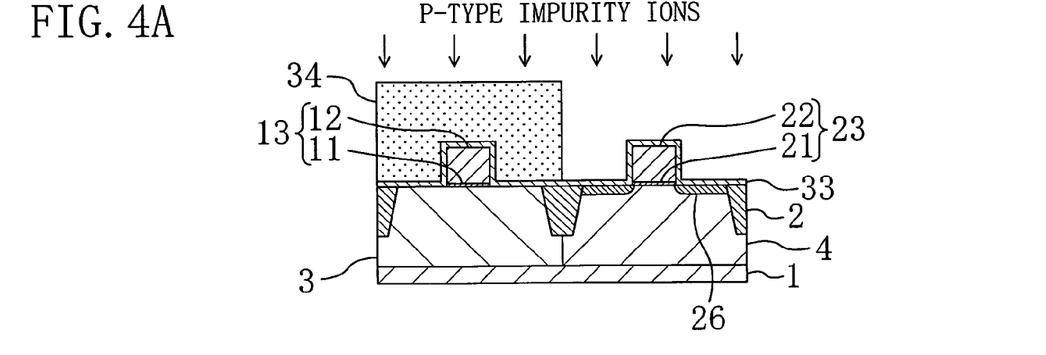
FIGS. 4A, 4B and 4C are cross-sectional view for showing procedures in a method for fabricating a semiconductor device according to a modification of Embodiment 1.
Figure 4B:
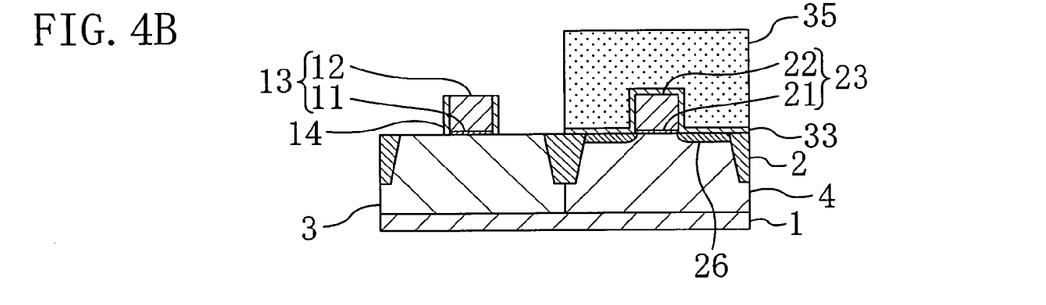
Figure 4C:
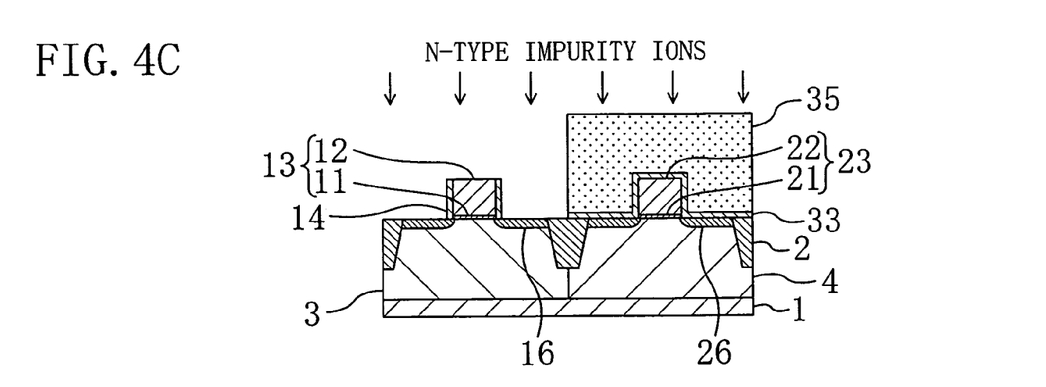

A method for fabricating a semiconductor device according to a modification of Embodiment 1 will now be described with reference to the accompanying drawings. FIGS. 4A through 4C are cross-sectional views for showing procedures in the method for fabricating a semiconductor device of this modification. Since procedures up to the formation of an oxide film 33 on a semiconductor substrate are the same as those of Embodiment 1, the description is herein omitted.

In this modification, as shown in FIG. 4A, a resist mask 34 having an opening in a PMOS region 4 and covering an NMOS region 3 is formed on the oxide film 33. Subsequently, by using a portion of the oxide film 33 formed on each side face of a gate portion 23 of the PMOS transistor as an offset spacer forming mask, a p-type impurity is implanted into the PMOS region 4, so as to form p-type extension regions 26.

Next, as shown in FIG. 4B, the resist mask 34 is removed. Thereafter, a resist mask 35 having an opening in the NMOS region 3 and covering the PMOS region 4 is formed on the oxide film 33. Subsequently, by using the resist mask 35 as a mask, a portion of the oxide film 33 formed in the NMOS region 4 is etched back, so as to form an offset spacer 14 on each side face of a gate portion 13 of the NMOS transistor.

Then, as shown in FIG. 4C, by using the thus formed offset spacer 14 as a mask, an n-type impurity is implanted into the NMOS region 3, so as to form n-type extension regions 16. Thereafter, a sidewall 15 of the gate portion 13 and a sidewall 25 of the gate portion 23 are formed in the same manner as in Embodiment 1, and ion implantation is performed by using these sidewalls as a mask, so as to form n-type source/drain diffusion layers 17 and p-type source/drain diffusion layers 27.

In this modification, since the NMOS region 3 is covered with the oxide film 33 in forming the p-type extension regions 26, the NMOS region 3 can be prevented from being contaminated with the p-type impurity. Therefore, a non-volatile element such as indium can be used as the p-type impurity.

Embodiment 2

Figure 5:
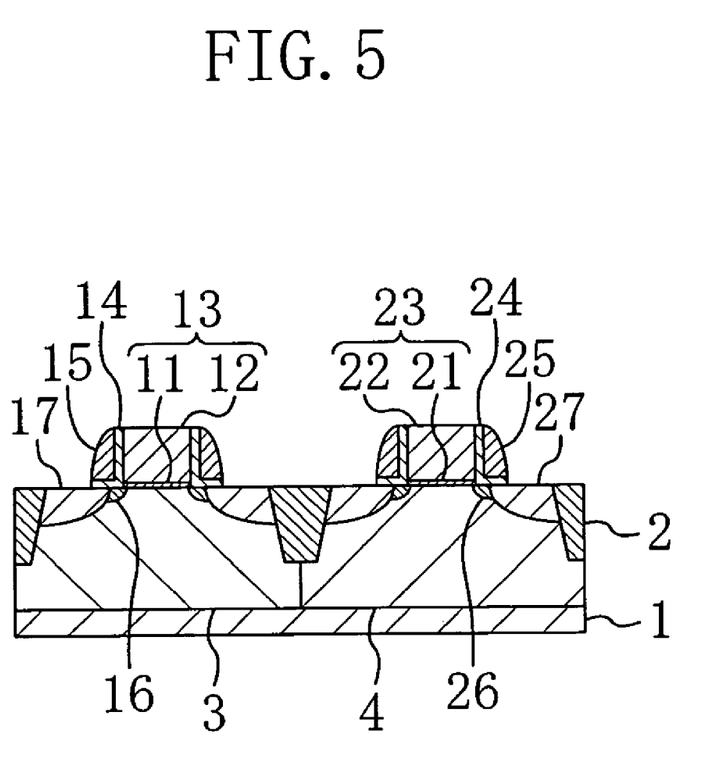
FIG. 5 is a cross-sectional view of a semiconductor device according to Embodiment 2 of the invention.

A semiconductor device and a fabrication method for the same according to Embodiment 2 of the invention will now be described with reference to the accompanying drawings. FIG. 5 shows the cross-sectional structure of the semiconductor device of this embodiment. As shown in FIG. 5, an NMOS region 3 including a p-type well and a PMOS region 4 including an n-type well spaced from each other by an isolation 2 are formed in a semiconductor substrate 1 of silicon.

A gate portion 13 of an NMOS transistor composed of a gate insulating film 11 and a gate electrode 12 successively formed in the upward direction is formed on the NMOS region 3. A gate portion 23 of a PMOS transistor composed of a gate insulating film 21 and a gate electrode 22 successively formed in the upward direction is formed on the PMOS region 4.

N-type source/drain diffusion layers 17 corresponding to impurity diffusion layers where ions of an n-type impurity such as arsenic are implanted are formed in the NMOS region 3. The n-type source/drain diffusion layers 17 include n-type extension regions 16 formed in portions thereof below both side faces of the gate portion 13 and having a comparatively small junction depth. Similarly, p-type source/drain diffusion layers 27 where ions of a p-type impurity such as boron are implanted and which include p-type extension regions 26 are formed in the PMOS region 4.

An L-shaped offset spacer 14 made of an oxide film is formed on each side face of the gate portion 13 of the NMOS transistor and on the top face of the semiconductor substrate 1 around the gate portion 13. A sidewall 15 of SiN is formed on the side face and the bottom of the offset spacer 14.

Similarly, an L-shaped offset spacer 24 made of an oxide film is formed on and around the gate portion 23 of the PMOS transistor, and a sidewall 25 of SiN is formed on the side face and the bottom of the offset spacer 24.

Now, the fabrication method for the semiconductor device of this embodiment will be described with reference to the accompanying drawings. FIGS. 6A through 6D are cross-sectional views for showing procedures in the fabrication method for the semiconductor device of this embodiment. Procedures up to the formation of an oxide film 33 on a semiconductor substrate are the same as those of Embodiment 1 and the description is herein omitted.

Figure 6A:
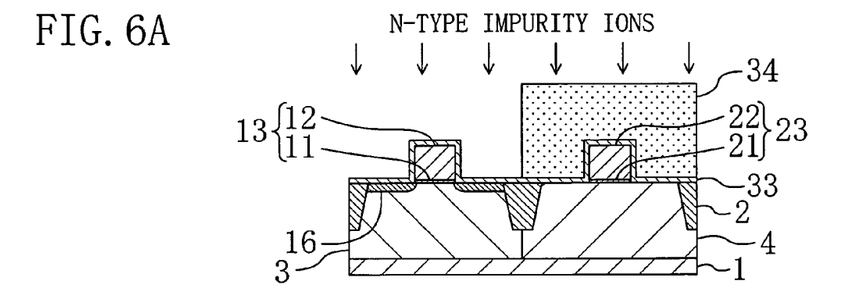
FIGS. 6A, 6B, 6C and 6D are cross-sectional views for showing procedures in a method for fabricating the semiconductor device of Embodiment 2.

In this embodiment, as shown in FIG. 6A, a resist mask 34 having an opening in an NMOS region 3 and covering a PMOS region 4 is formed on the oxide film 33. Thereafter, by using a portion of the oxide film 33 formed on each side face of the gate portion 13 as an offset spacer forming mask, an n-type impurity such as arsenic is implanted through the oxide film 33 into portions of the NMOS region 3 below the side faces of the gate portion 13 of the NMOS transistor, so as to form n-type extension regions 16. The ion implantation is performed at a dose of $2\times10^{14}$ ions/cm$^2$ through $5\times10^{15}$ ions/cm$^2$ and implantation energy of 0.1 keV through 10 keV so as to make the junction comparatively shallow.

Figure 6B:
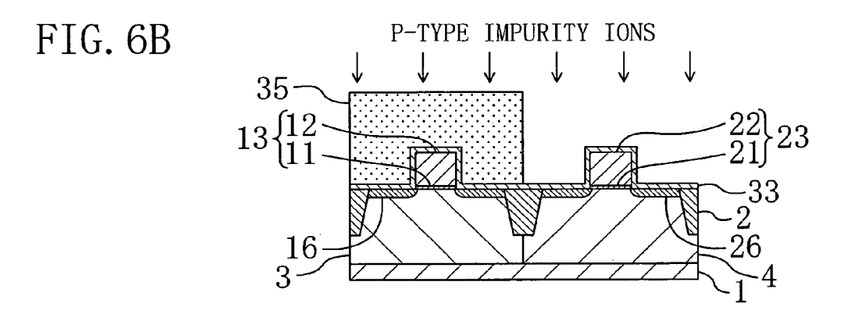

Then, as shown in FIG. 6B, the resist mask 34 is removed by the ashing and the cleaning. Subsequently, a resist mask 35 having an opening in the PMOS region 4 and covering the NMOS region 3 is formed on the substrate. Thereafter, by using a portion of the oxide film 33 formed on each side face of the gate portion 23 as an offset spacer forming mask, a p-type impurity such as boron is implanted through the oxide film 33 into portions of the PMOS region 4 below the side faces of the gate portion 23 of the PMOS transistor, so as to form p-type extension regions 26. The ion implantation is performed by implanting boron at implantation energy of 0.1 keV through 5 keV and a dose of $1\times10^{14}$ ions/cm$^2$ through $5\times10^{15}$ ions/cm$^2$.

Figure 6C:
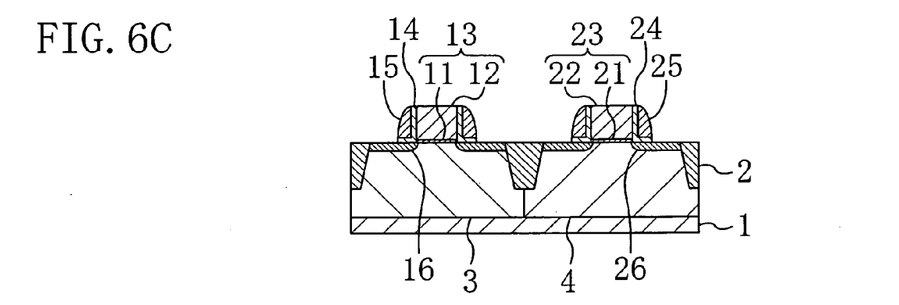

Subsequently, as shown in FIG. 6C, after removing the resist mask 35, a SiN film with a thickness of approximately 65 nm is deposited on the semiconductor substrate 1, and an unwanted portion of the SiN film is removed by the etch back. Thus, an L-shaped offset spacer 14 made of the oxide film 33 is formed on each side face of the gate portion 13 of the NMOS transistor and a sidewall 15 made of the SiN film is formed so as to cover the side face and the bottom of the offset spacer 14.

On the other hand, an L-shaped offset spacer 24 is also formed on each side face of the gate portion 23 of the PMOS transistor, and a sidewall 25 is formed so as to cover the side face and the bottom of the offset spacer 24.

Figure 6D:
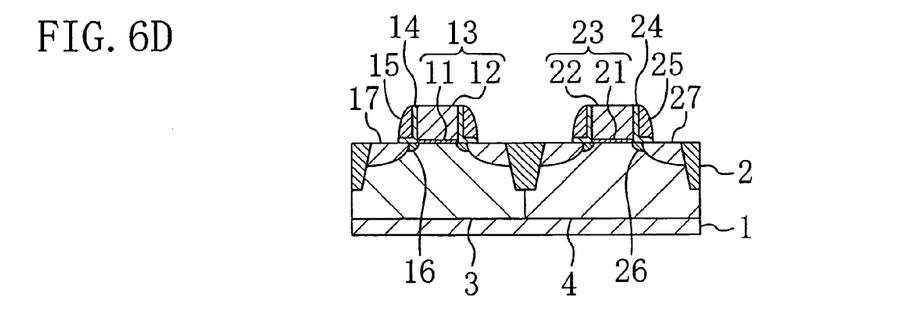

Next, as shown in FIG. 6D, an n-type impurity is selectively implanted into the NMOS region 3 by using the offset spacer 14 and the sidewall 15 as an implantation mask. Also, a p-type impurity is selectively implanted into the PMOS region 4 by using the offset spacer 24 and the sidewall 25 used as an implantation mask. The ion implantation of the n-type impurity is performed at implantation energy of 10 keV through 100 keV and a dose of $1\times10^{15}$ ions/cm$^2$ through $5\times10^{16}$ ions/cm$^2$, and the ion implantation of the p-type impurity is performed at implantation energy of 1 keV through 10 keV and a dose of $1\times10^{15}$ ions/cm$^2$ through $5\times10^{16}$ ions/cm$^2$.

Thereafter, the impurities are activated through annealing, so as to form n-type source/drain diffusion layers 17 and p-type source/drain diffusion layers 27.

In the method for fabricating the semiconductor device of this embodiment, the oxide film 33 is used as the offset spacer for forming the n-type extension regions 16, and therefore, there is no need to etch back the oxide film 33.

Also, since the top face of the NMOS region 3 is protected by the oxide film 33 in forming the p-type extension regions 26, even when a minimally volatile element such as indium is used as the p-type impurity, the top face of the NMOS region 3 can be prevented from being contaminated with the p-type impurity.

Embodiment 3

Figure 7:
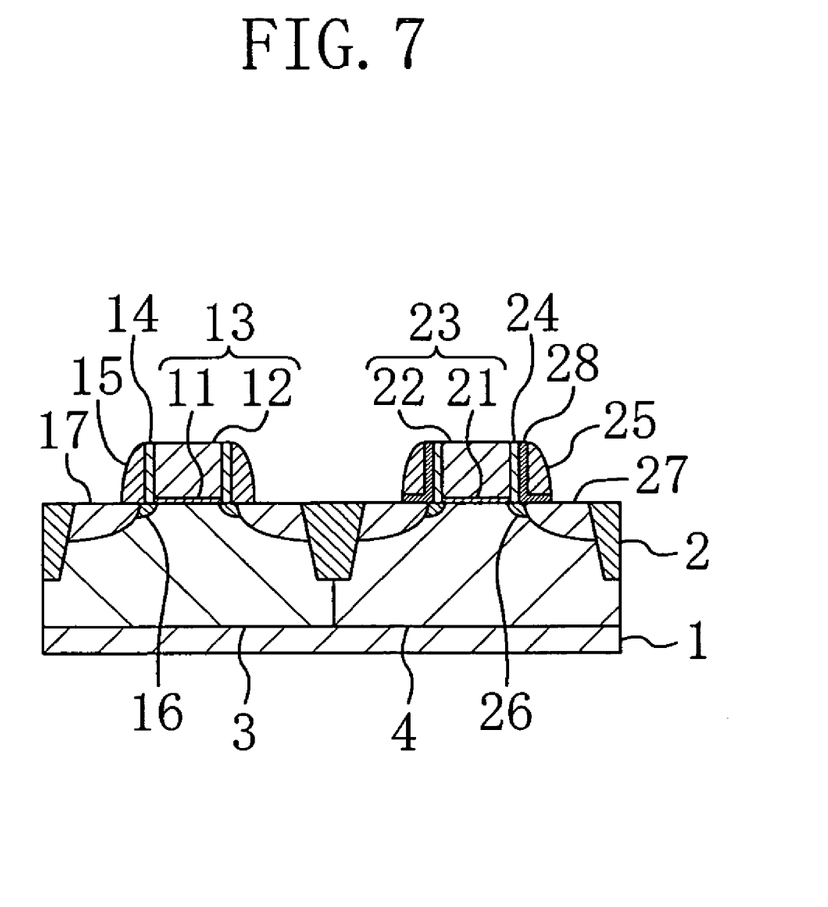
FIG. 7 is a cross-sectional view of a semiconductor device according to Embodiment 3 of the invention.

A semiconductor device and a fabrication method for the same according to Embodiment 3 of the invention will now be described with reference to the accompanying drawings. FIG. 7 shows the cross-sectional structure of the semiconductor device of this embodiment. As shown in FIG. 7, an NMOS region 3 including a p-type well and a PMOS region 4 including an n-type well spaced from each other by an isolation 2 are formed in a semiconductor substrate 1 of silicon.

A gate portion 13 of an NMOS transistor composed of a gate insulating film 11 and a gate electrode 12 successively formed in the upward direction is formed on the NMOS region 3. A gate portion 23 of a PMOS transistor composed of a gate insulating film 21 and a gate electrode 22 successively formed in the upward direction is formed on the PMOS region 4.

N-type source/drain diffusion layers 17 corresponding to impurity diffusion layers where ions of an n-type impurity such as arsenic are implanted are formed in the NMOS region 3. The n-type source/drain diffusion layers 17 include n-type extension regions 16 formed in portions thereof below both side faces of the gate portion 13 and having a comparatively small junction depth. Similarly, p-type source/drain diffusion layers 27 where ions of a p-type impurity such as boron are implanted and which include p-type extension regions 26 are formed in the PMOS region 4.

An I-shaped (plate-shaped) offset spacer 14 made of an oxide film is formed on each side face of the gate portion 13 of the NMOS transistor. A sidewall 15 of SiN is formed so as to cover the side face of the offset spacer 14.

On the other hand, an I-shaped (plate-shaped) offset spacer 24 made of an oxide film is formed on each side face of the gate portion 23 of the PMOS transistor. An L-shaped protecting film 28 is formed on the side face of the offset spacer 24 and on the top face of the semiconductor substrate around the offset spacer 24, and a sidewall 25 of SiN is formed so as to cover the side face and the bottom of the protecting film 28. In the semiconductor device of this embodiment, the protecting film 28 includes an n-type impurity such as arsenic.

Now, the fabrication method for the semiconductor device of this embodiment will be described with reference to the accompanying drawings. FIGS. 8A through 8E are cross-sectional views for showing procedures in the fabrication method for the semiconductor device of this embodiment. Procedures up to the formation of an oxide film 33 on a semiconductor substrate are the same as those of Embodiment 1 and the description is herein omitted.

Figure 8A:
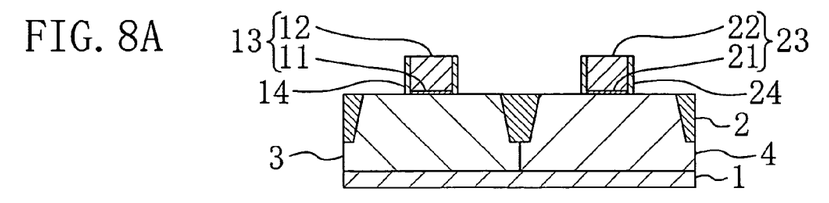
FIGS. 8A, 8B, 8C, 8D and 8E are cross-sectional views for showing procedures in a method for fabricating the semiconductor device of Embodiment 3.

As shown in FIG. 8A, a portion of the oxide film 33 excluding portions thereof formed on the side faces of a gate portion 13 and a gate portion 23 is removed by the etch back, so as to form an offset spacer 14 on each side face of the gate portion 13 and an offset spacer 24 on each side face of the gate portion 23.

Figure 8B:
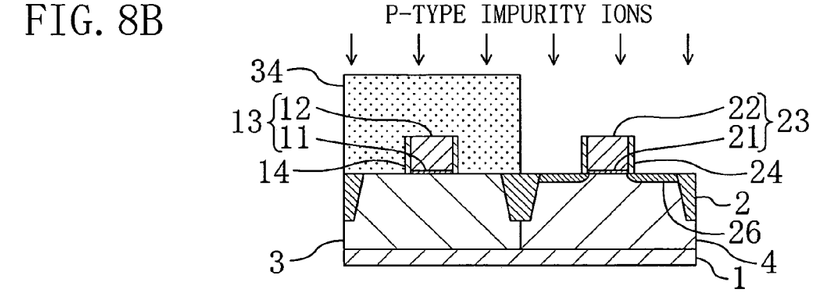

Next, as shown in FIG. 8B, a resist mask 34 having an opening in a PMOS region 4 and covering an NMOS region 3 is formed on the substrate 1. Thereafter, by using a gate electrode 22, the offset spacer 24 and the resist mask 34 as a mask, a p-type impurity such as boron is implanted into portions of the PMOS region 4 below the side faces of the gate portion 13 of the PMOS transistor, so as to form p-type extension regions 26.

Figure 8C:
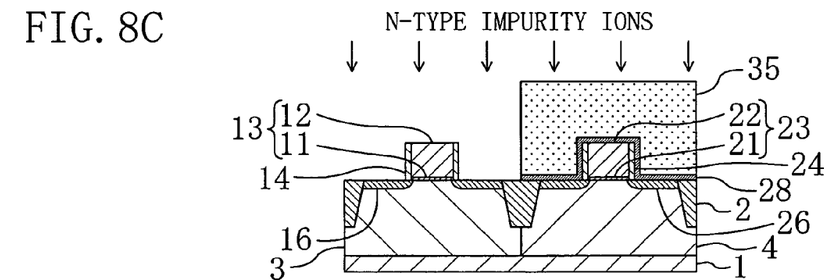

Then, as shown in FIG. 8C, a protecting film 28 of silicon oxide covering the PMOS region 4 is selectively formed by the CVD. Subsequently, after the resist mask 34 is removed by the ashing and the cleaning, a resist mask 35 having an opening in the NMOS region 3 and covering the PMOS region 4 where the protecting film 28 has been formed is formed on the substrate. Thereafter, by using a gate electrode 12, the offset spacer 14 and the resist mask 35 as a mask, an n-type impurity such as arsenic is implanted into portions of the NMOS region 3 below the side faces of the gate portion 13 of the NMOS transistor, so as to form n-type extension regions 16.

Figure 8D:
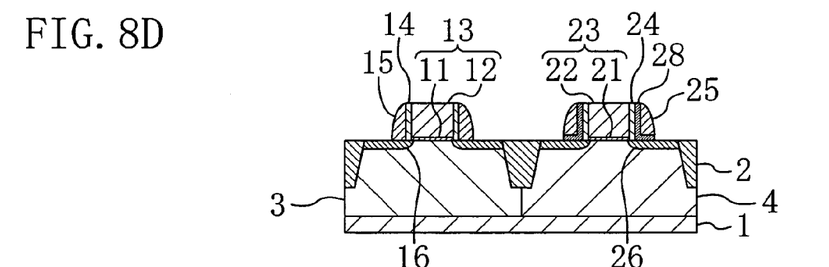

Subsequently, as shown in FIG. 8D, after removing the resist mask 35, a SiN film with a thickness of approximately 65 nm is deposited on the semiconductor substrate 1, and an unwanted portion of the SiN film is removed by the etch back. Thus, a sidewall 15 is formed on each side face of the gate portion 13 of the NMOS transistor with the offset spacer 14 sandwiched therebetween.

On the other hand, a sidewall 25 is formed on each side face of the gate portion 23 of the PMOS transistor with the offset spacer 24 and the L-shaped protecting film 28 sandwiched therebetween.

Figure 8E:
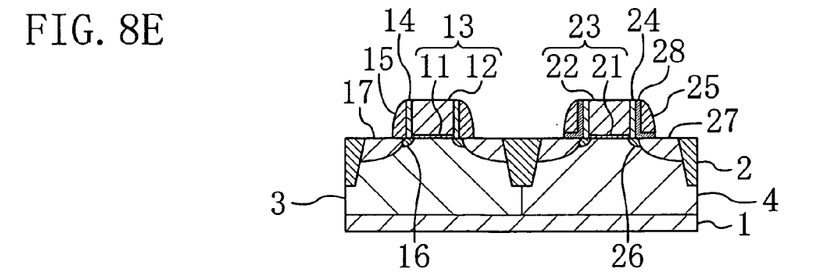

Next, as shown in FIG. 8E, an n-type impurity is selectively implanted into the NMOS region 3 by using the offset spacer 14 and the sidewall 15 as an implantation mask. Also, a p-type impurity is selectively implanted into the PMOS region 4 by using the offset spacer 24, the protecting film 28 and the sidewall 25 as an implantation mask. Thereafter, the impurities are activated through annealing, so as to form n-type source/drain diffusion layers 17 and p-type source/drain diffusion layers 27.

In the method for fabricating the semiconductor device of this embodiment, the implantation mask used for forming the p-type extension regions 26 is different from the protecting film used for preventing the diffusion of the n-type impurity. Therefore, the offset position of the p-type extension region 26 can be freely set.

Although the protecting film is provided in the PMOS region 4 alone in this embodiment, if the protecting film is provided also in the NMOS region 3, the NMOS region 3 can be prevented from being contaminated with the p-type impurity when indium is used as the p-type impurity.

In the semiconductor device and the method for fabricating the same of this invention, an impurity implanted into a resist mask used in ion implantation can be prevented from doping an extension forming region during ashing, and therefore, characteristic degradation of a transistor can be avoided. Therefore, the invention is useful for a semiconductor device in which both an NMOS transistor and a PMOS transistor are mixedly provided on a substrate and a method for fabricating the same.

What is claimed is:

1. A semiconductor device comprising:
 a transistor of a first conductivity type and a transistor of a second conductivity type,
 wherein said transistor of the first conductivity type includes:
 a first gate portion including a first gate insulating film and a first gate electrode formed on a first region of a semiconductor substrate;
 a first sidewall made of a first insulating film formed on a side face of said first gate portion;
 a first protecting film formed between said first sidewall and said first gate portion; and
 an extension diffusion layer of the first conductivity type formed in a portion of said first region on a side of said first gate portion, and
 said transistor of the second conductivity type includes:
 a second gate portion including a second gate insulating film and a second gate electrode formed on a second region of said semiconductor substrate;
 a second sidewall made of said first insulating film formed on a side face of said second gate portion;
 a second protecting film having an L-shaped cross-section and formed between said second sidewall and said second gate portion and between said second sidewall and said semiconductor substrate; and an extension diffusion layer of the second conductivity type formed in a portion of said second region on a side of said second gate portions, wherein said first protecting film and said second protecting film are made of a second insulating film, and said first protecting film has an I-shaped cross-section.

2. The semiconductor device of claim 1, wherein said first protecting film includes an impurity of the second conductivity type.

3. The semiconductor device of claim 2, wherein said impurity of the second conductivity type is indium.

4. The semiconductor device of claim 1, wherein said second protecting film includes an impurity of the first conductivity type.

5. The semiconductor device of claim 4, wherein said impurity of the first conductivity type is arsenic or antimony.

6. The semiconductor device of claim 1, wherein said transistor of the first conductivity type is an n-type MOS transistor, and said transistor of the second conductivity type is an n-type MOS transistor.

7. A semiconductor device comprising:

a transistor of a first conductivity type and a transistor of a second conductivity type, wherein said transistor of the first conductivity type includes:

a first gate portion including a first gate insulating film and a first gate electrode formed on a first region of a semiconductor substrate;

a first sidewall made of a first insulating film formed on a side face of said first gate portion;

a first protecting film formed between said first sidewall and said first gate portion; and an extension diffusion layer of the first conductivity type formed in a portion of said first region on a side of said first gate portion, and said transistor of the second conductivity type includes:

a second gate portion including a second gate insulating film and a second gate electrode formed on a second region of said semiconductor substrate;

a second sidewall made of said first insulating film formed on a side face of said gate portion;

a second protecting film having an L-shaped cross-section and formed between said second sidewall and said second gate portion and between said second sidewall and said semiconductor substrate; and an extension diffusion layer of the second conductivity type formed in a portion of said second region on a side of said second gate portion, wherein said transistor of the second conductivity type further includes a third protecting film formed between said second gate portion and said second protecting film, said first protecting film and said third protecting film are made of a second insulating film having an I-shaped cross-section, and said second protecting film is made of a third insulating film.

* * * * *